United States Patent
Bird

(10) Patent No.: US 6,549,684 B2
(45) Date of Patent: *Apr. 15, 2003

(54) IMAGE SENSOR HAVING AN ARRAY WITH INTEGRATED CONTROL CIRCUITRY WHICH INCLUDES CONSTANTLY-ILLUMINATED PHOTODIODES

(75) Inventor: Neil C. Bird, Horley Surrey (GB)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/798,891

(22) Filed: Feb. 11, 1997

(65) Prior Publication Data

US 2002/0009238 A1 Jan. 24, 2002

(30) Foreign Application Priority Data

Feb. 14, 1996 (GB) .............................. 9603052

(51) Int. Cl.[7] .............................. G06K 7/10; G06K 9/20
(52) U.S. Cl. .................. 382/321; 250/208.1; 257/72; 348/308; 348/310
(58) Field of Search .................... 382/312, 321, 382/317; 358/482; 348/294, 302, 307, 308, 309, 310, 311, 322; 250/208.1, 208.2, 208.3, 208.4, 214.1, 214 R; 257/721, 458

(56) References Cited

U.S. PATENT DOCUMENTS

| | | | | |
|---|---|---|---|---|
| 4,499,384 A | * | 2/1985 | Segawa et al. | 358/482 |
| 4,556,800 A | * | 12/1985 | Ohta et al. | 358/484 |
| 4,644,406 A | * | 2/1987 | Nishigaki et al. | 358/482 |
| 4,758,734 A | * | 7/1988 | Uchida et al. | 348/294 |
| RE32,893 E | * | 3/1989 | Miller | 257/458 |
| 5,149,955 A | * | 9/1992 | Kitamura et al. | 257/435 |
| 5,442,198 A | * | 8/1995 | Arai et al. | 257/64 |
| 5,451,767 A | * | 9/1995 | Amano et al. | 250/214.1 |
| 5,591,988 A | * | 1/1997 | Arai et al. | 257/72 |

FOREIGN PATENT DOCUMENTS

EP 0154997 A2 9/1985 ........... H01L/27/14

* cited by examiner

Primary Examiner—Timothy M. Johnson

(57) ABSTRACT

An image sensor (10) includes an array having an image sensing portion (12) and a control portion (14). Pixels (18) of the image sensing portion and devices (20) of the control circuitry portion each have a diode stack (34) of a back-to-back switching diode (36, 38, 40) and a photodiode (42, 44, 46). The photodiodes of the devices (20) are constantly illuminated in use so that they act as current sources in series with the switching diode. This provides a circuit device which has characteristics enabling its use in control circuitry.

10 Claims, 5 Drawing Sheets

IMAGE SENSOR HAVING AN ARRAY WITH INTEGRATED CONTROL CIRCUITRY WHICH INCLUDES CONSTANTLY-ILLUMINATED PHOTODIODES

BACKGROUND OF THE INVENTION

This invention relates to an image sensor and more particularly to an image sensor comprising an array having control circuitry integrated onto the same substrate as image sensing pixels of the array.

Large area integrated circuit image sensor arrays are known using diode-based pixel arrangements. For example, EP-0-154 997 discloses an image sensor in which each image sensing pixel comprises a photodiode connected in series with a switching diode, the two diodes being connected with opposite polarity.

It is desired to reduce the dimensions of the pixels of image sensing arrays so as to increase the image sensing resolution. For example, some applications require a resolution of 600 dpi (dots per inch) which corresponds to a maximum pixel dimension of 42 µm (micrometers.) Conventional pixel arrangements which utilise a switching diode and a photodiode are arranged so that these components are positioned adjacent one another, such that layers deposited on the substrate are shared between the two diode devices. This gives rise to the problem that the two diode devices must necessarily have the same construction, and the requirement for each pixel to include two side by side diodes limits the possible reduction in size of the pixel.

The pixel arrangement of EP-0-154 997 provides a stacked arrangement with the photodiode and the switching diode disposed one above the other. This has the advantage that a further reduction in the size of the pixel is possible and the layers used for the switching diode and for the photodiode can be optimised for each respective diode.

A further problem encountered with the prior art is that the large number of pixels give rise to a very high number of connections to the array of image sensor pixels. Various multiplexer circuits have been proposed which may be integrated onto the substrate of the image sensor array, so as to reduce the number of connections which must be made to the array. Of course, the multiplexer circuits, or other control circuitry to be integrated onto the substrate of the image sensor pixels, must utilise device elements corresponding to the elements of the image sensor pixels.

The image sensor pixels of EP-0-154 997 comprise a pair of back to back diodes, and this document does not address the problems associated with the control and interfacing of the array.

SUMMARY OF THE INVENTION

The present invention aims to provide a pixel arrangement which allows a reduction in the pixel size, and hence an increased image sensor resolution, and which has control circuitry integrated onto the substrate of the image sensor array.

According to the present invention, there is provided an image sensor comprising an array having an imaging area comprising a plurality of image sensing pixels, and control circuitry comprising a plurality of elemental devices, the image sensing pixels and elemental devices being provided on a common substrate and being defined by layers provided on the substrate, each pixel and each elemental device comprising a diode stack, of a photodiode and a switching diode connected in series with opposite polarity and disposed one above the other with respect to the substrate, the image sensor further comprising illumination means for illuminating the photodiodes of the elemental devices of the control circuitry.

In the image sensor of the invention, the stacked diode pixel configuration enables the pixel dimensions to be reduced and enables the layers provided on the substrate to be optimised with respect to the devices being produced. The illumination of the photodiodes of the control circuitry enables the back to back diode arrangement to be used as circuit elements. In particular, this illumination of the photodiodes has the effect of operating each photodiode as a constant current source. This enables the switching diodes to be used as normal switching elements, and the effect of the constant current source in series with the switching diode is to provide limitation of the peak current flowing through the switching diode.

Preferably, the photodiode and switching diode comprise amorphous silicon devices, and the diode stack preferably comprises a p-i-n-i-p structure, one of the switching diode and photodiode being a p-i-n device, and the other being an n-i-p device. However, other combinations of diode configurations may be used.

Preferably, a light shielding layer is provided within each diode stack between the photodiode and the switching diode. This prevents the passage of light not absorbed by the photodiode into the switching diode structure.

The photodiode may be disposed above the switching diode with respect to the substrate, and in this case the illumination means provides light to the image sensor array from the side of the substrate opposite to the layers provided on the substrate, and reflection means is provided over the control circuitry for reflecting the light to the photodiodes of the elemental devices.

Alternatively, the photodiode may be disposed below the switching diode with respect to the substrate, and in this case the layers provided on the substrate are preferably disposed over a conducting contact portion, each contact portion including an opening which allows the passage of light to the photodiode of the respective diode stack.

When the image sensor comprises a document imaging system the illumination means preferably comprises a light source of the image sensor for illuminating the document to be imaged, so that the image sensor requires only a single light source arrangement. However, the control circuitry may be illuminated separately from the imaging light source of the sensor array.

The pixels are preferably arranged in rows and columns, and the control circuitry may comprise row driver circuitry and/or column reading circuitry.

BRIEF DESCRIPTION OF THE DRAWING

Embodiments of the invention will now be described by way of example, with reference to the accompanying drawings, in which.

DESCRIPTION OF THE PREFERRED EMBODIMENTS

Figure 1:
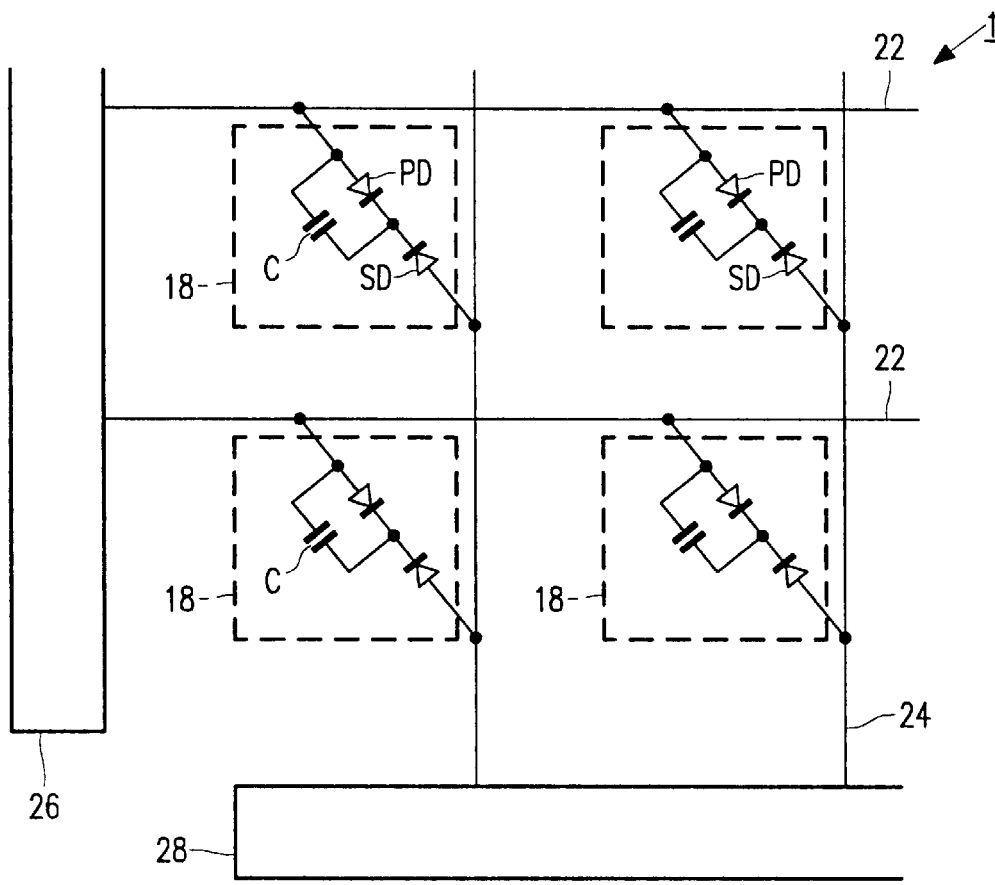
FIG. 1 shows a portion of a known image sensor array.

It of course be understood that the drawings are not to scale and that like reference numerals are used throughout the text to refer to like parts.

Figure 3:
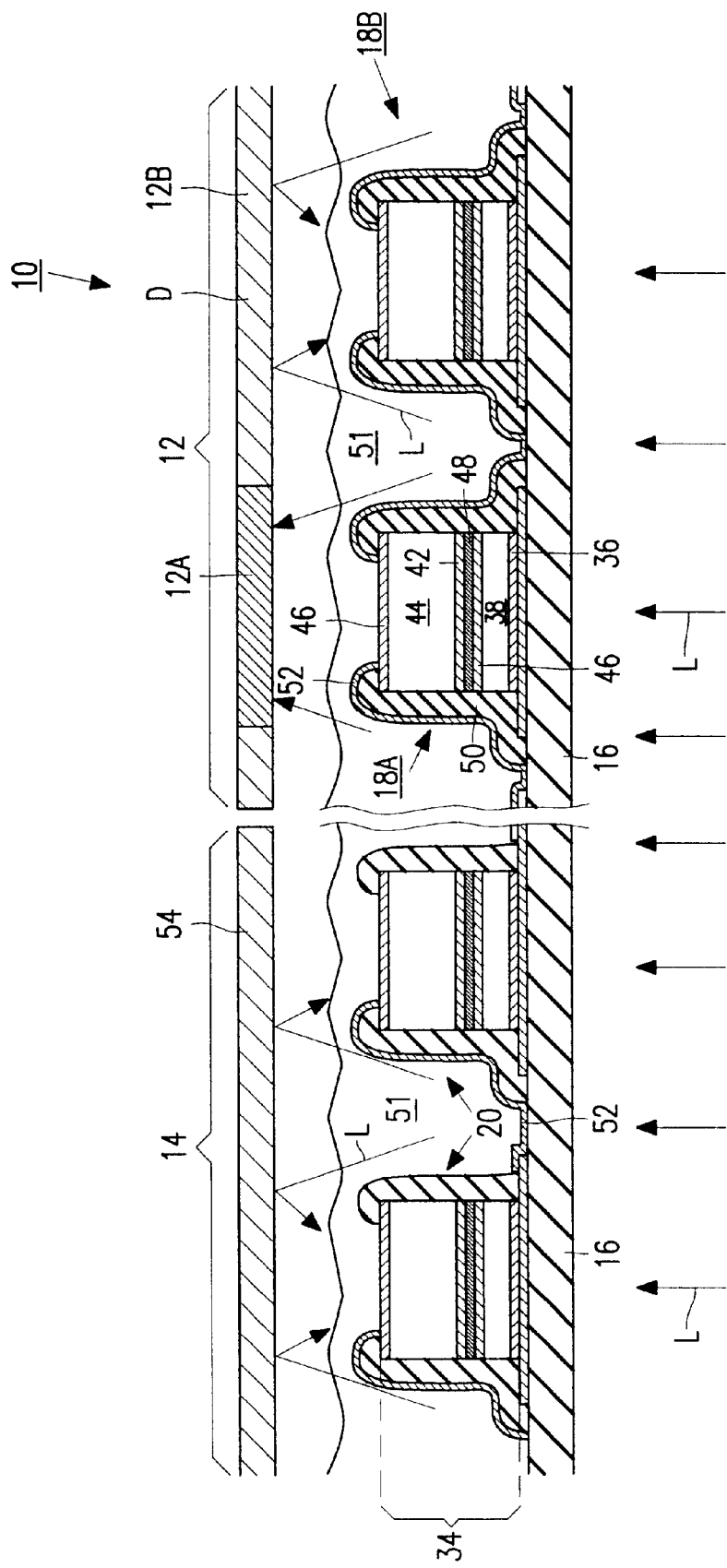
FIG. 3 shows an image sensor array according to the invention.

As shown in FIG. 3, the invention provides an image sensor 10, comprising an image sensing area 12 and control circuitry 14 provided on a common substrate 16. The image sensing area 12 comprises a plurality of pixels 18 and the control circuitry 14 comprises a plurality of elemental devices 20. The pixels 18 and the elemental devices 20 comprise layers deposited on the substrate 16 which define two series connected diodes of opposite polarity. One of the two diodes acts as a photodiode and the other acts as a switching diode. The photodiodes of the pixels 18 are used for sensing an image from a document D whereas the photodiodes of the elemental devices 20 are constantly illuminated by light L so that they act as current sources connected in series with the switching diodes. The series-connected current source and switching diode has a response which is suitable for use as circuit elements of the control circuitry 14.

FIG. 1 shows an example of four pixels of a known image sensor 10. Although only four pixels 18 are shown, the image sensor 10 will comprise a two dimensional matrix of rows and columns of pixels 18 with associated row 22 and column 24 conductors.

Each pixel 18 comprises a photodiode PD and a switching diode SD coupled in series between the associated the row conductor 22 and column conductor 24. In the example shown, the switching diode SD and the photodiode PD are arranged with the cathodes coupled together, although they may be connected at the anodes and the positions of the photodiode and the switching diode shown in FIG. 1 may be interchanged. A capacitor C is shown coupled across the photosensitive diode PD. This capacitor C may be the parasitic capacitance of the photosensitive diode PD or may be an additional capacitor added to increase the dynamic range of the image sensor 10. Preferably, the capacitor represents the self-capacitance of the photodiode since an additional capacitor will occupy pixel area and/or require additional deposition of layers and etching masks.

During operation of the image sensor 10 shown in FIG. 1, light is incident upon the photodiodes PD of each pixel 18, the intensity being dependent upon the document to be imaged. The conventional way of reading an image sensor pixel is to charge the photodiode capacitances C of a row by means of a row voltage waveform, and then to allow these capacitors to discharge so that they supply the photodiode current during the so-called integration period. During this period, the switching diode is reversed biased (namely the row voltage is high with respect to the column voltage for the pixel configuration shown in FIG. 1) while the capacitor discharges at a rate which depends upon the incident light. When the image sensor pixel is to be read, a reading signal is applied to the row (which comprises a negative pulse with respect to the column voltage for the pixel configuration shown in FIG. 1), and the current which flows between the column conductor 24 and the row conductor 22 is the current required to recharge the photodiode capacitance and represents the total illumination of the photodiode over the whole of the previous integration period.

A row driver circuit 26 provides the signals for controlling the voltages applied to the row conductor 22, and column reading circuitry 28 includes charge sensitive amplifiers which measure the current required to recharge the photodiode capacitances C.

There is a demand for increased image sensing resolution of image sensors such as that shown in FIG. 1. In order to achieve this increased resolution, the dimensions of each pixel 18 must be reduced. For example, if an image sensor is to have a resolution of 600 dpi (dots per inch) the available space for each pixel 18 comprises a square having sides of 42 micrometers. A problem therefore arises in forming the elements of each pixel 18 within the available space. Conventionally, the photodiode and switching diode have been positioned side by side, so that the two diode devices may be formed simultaneously by the deposition of semiconductor layers. This has the disadvantage that the photodiode and the switching diode must have the same configuration and the layers used cannot therefore be optimised for one or other device. Furthermore, the switching diode must be shielded from incident light to prevent the generation of photocurrents.

Figure 2:
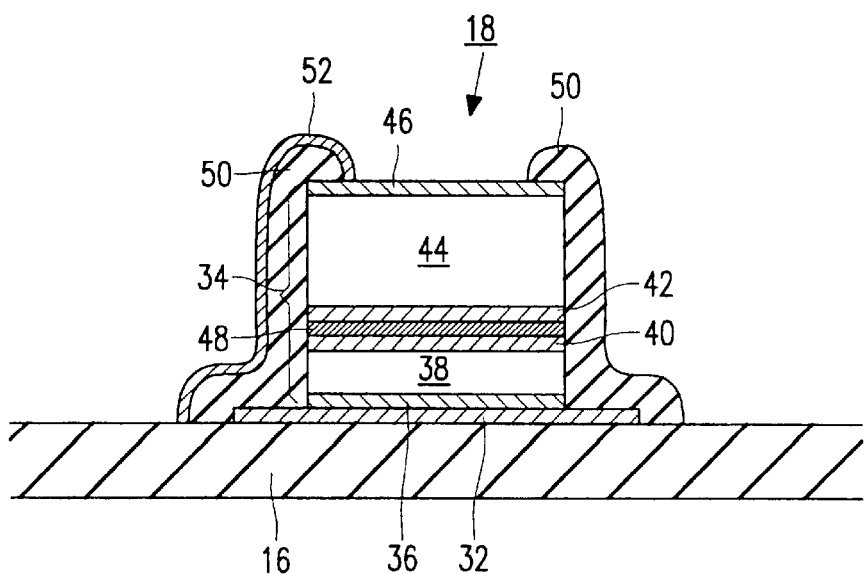
FIG. 2 shows a stacked diode pixel configuration.

FIG. 2 shows a recently developed pixel configuration which overcomes the above disadvantages of the more conventional pixel configuration.

The pixel 18 comprises semiconductor layers deposited on an insulating substrate 16, such as glass. A bottom metal contact 32 is deposited on the glass substrate 16, and may for example comprise a chromium layer. A diode stack 34 is then deposited over the contact 32, and the diode stack 34 comprises the back to back photodiode PD and switching diode SD of FIG. 1. The diode stack 34 may be formed by consecutive deposition of amorphous silicon ($\alpha$-Si) layers. These layers may, for example, be deposited by plasma enhanced chemical vapour deposition (PECVD). Of course, other known techniques may be adopted. In the example shown in FIG. 2, the switching diode is deposited closest to the substrate 30 and comprises a p-i-n junction diode comprising a p-type semiconductor layer 36, followed by an undoped $\alpha$-Si layer 38 and an n-type semiconductor layer 40.

The switching diode may, however, be formed as a schottky junction diode, MIM, or as an MIS type diode by appropriate selection of semiconductor and metallic layers.

The photodiode PD is disposed above the switching diode in the pixel arrangement shown in FIG. 2 and comprises an NIP structure, thereby forming a back to back diode pair with the switching diode SD. Thus, the photodiode comprises an n-type layer 42, an intrinsic semiconductor layer 44 and a p-type layer 46. Similarly, the photodiode PD may alternatively be formed as a schottky junction diode or an MIS type diode. A top contact of inodium tin oxide (ITO) may be provided over the p-type layer 46, which acts as an anti-reflection layer, although this is not shown in the figures.

In the pixel arrangement shown in FIG. 2, the upper diode of the diode stack 34 comprises the photosensitive diode, and light to be sensed will therefore be incident from above the pixel. Thus, the bottom metal contact 32 provides light shielding for the lower switching diode 36, 38, 40, and the photodiode 42, 44, 46 will absorb incident light before it reaches the switching diode beneath. However, some light will pass through the photodiode, and to eliminate any photosensitivity of the switching diode, a metallic shielding layer 48 is shown in FIG. 2 disposed between the switching diode and photodiode. This will divide the formation of the diode stack into two consecutive CVD processes, one before the metal deposition and one after. The layer 48 may comprise a chromium layer. Of course, this layer may be omitted, giving rise to a PINIP structure. Of course, if the diodes are connected at their cathodes, a NIPIN structure will result.

A passivation layer 50 is deposited over the diode stack 34 and may be formed by deposition of silicon nitride or silicon dioxide followed by appropriate etching. An electrode layer 52 is formed over the passivation layer 50 which makes contact with the top surface of the diode stack 34, and a polymer 51, for example a polymer resin, may cover the array.

The pixel configuration shown in FIG. 2 enables the size of each pixel to be reduced. Furthermore, the diode configuration for the switching diode and for the photodiode may be optimised. In particular, the i-layer thickness of the photodiode and switching diode may be different. This feature can be used to optimise the characteristics of the pixel in terms of photosensitivity, switching diode I–V characteristics and capacitance ratio, although the two diodes are constrained to have the same area. By way of example, FIG. 2 represents the lower switching diode having a thinner intrinsic semiconductor layer than that of the upper switching diode. Equally, the materials and level of doping may be selected according to the desired characteristics.

A further advantage of the pixel structure shown in FIG. 2 is that the image sensing array may be formed by a four mask process. A first mask defines the bottom metal contacts 32 (which form the column conductors 24 shown in FIG. 1), a second mask is used for etching the diode stack 34, a third mask is used for etching the passivation layer 50, and a fourth mask is used for forming the electrode layer 52. The electrode layer 52 forms the row conductors 22 shown in FIG. 1.

As can be seen in FIG. 1, each pixel 18 of the image sensor array is associated with a unique pair of row and column conductors 22, 24. An image sensor will, of course, comprise hundreds or thousands of rows and columns, and a problem arises in that an individual connection must be made to each row and to each column of the image sensing array. For example, an A4 document scanning having a resolution of 600 dpi will require approximately 5,000 rows and 7,000 columns (with the rows parallel to the long edge of the page). It is therefore desirable to integrate at least part of the row driver circuitry 26 and/or the column reading circuitry 28 onto the substrate of the image sensing array 10. Preferably, these circuits include multiplexer arrangements since the integration of multiplexer circuits onto the array may also reduce the number of connections which must be made to the image sensing array by external circuitry. Various diode-based multiplexer circuits have been developed for use in row driving circuitry and column reading circuitry. For example, British patent application No. 9512942.5 describes a column multiplexer which comprises switches based on diode bridge configurations. British patent application No. 9524657.5 discloses row driving circuitry incorporating diode-based multiplexer switches. These and other diode based circuits may be implemented by the control circuitry of the invention. The circuit elements of the control circuitry must be of the same type as the circuit elements of the image sensing array, to enable the image sensor array pixels and the control circuitry to be defined by the same deposition of layers on a common substrate.

A problem with the pixel arrangement of FIG. 2 is that the pair of back to back diodes cannot directly be used as circuit elements for the control circuitry. One possible way to utilise the diodes stack 34 as circuit elements of the control circuitry would be to introduce an additional masking step for etching away the upper diode of the diode stack 34 for the control circuitry. This step would be introduced before the formation of the passivation layer 50, and would result in the control circuitry being formed of individual diode elements.

The invention enables the diode stack 34 to be used as the element of the control circuitry without the requirement for additional masking steps.

As shown in FIG. 3, the image sensor 10 of the invention comprises an image sensing area 12 and control circuitry 14. The pixels 18 of the image sensing area 12 have the configuration shown in FIG. 2. Of course, any of the possible alternative diode arrangements described in relation to FIG. 2 may equally be applied to the sensor array of the invention. Two adjacent pixel elements are shown from the same row. For this reason, the upper faces of the diode stacks 34 are connected together by the electrode layer 52 which thereby forms the row conductor 22.

In order to illuminate the photodiodes of the image sensing area 12 of the image sensor array 10 shown in FIG. 3, a light source is provided which introduces light from the side of the substrate 16 opposite to the diode stacks 34 as shown by arrows L. Typically, this light source is an electroluminescent panel, which comprises a phosphor layer sandwiched between electrodes. Those skilled in the art will appreciate the various types of light source that may be used, and the light source is not therefore described or illustrated in detail. The document D to be imaged is placed above the array and the photodiodes are illuminated by reflection from the document D. For example, a relatively dark area 12A of the document D will absorb the light L and consequently the photodiode PD of pixel 18A will have a low level of illumination. This is represented by the absence of reflection from document portion 12A. In contrast, the light document portion 12B will reflect the incoming light L and the photodiode PD of the pixel 18B will be illuminated during the integration period.

According to the invention, the photodiodes of the diode stacks 34 which form the control circuitry 14 are constantly illuminated. In the example shown in FIG. 3 a single light source may be used for illumination of the document D and of the photodiodes of the control circuitry 14. For this purpose, a reflective surface 54 is shown over the control circuitry 14 of the array 10. This reflective surface 54 may comprise the housing of the image sensor array 10 or may comprise a closeable lid of the image sensor apparatus which may also have the function of securing the position of the document D. In FIG. 3 the top electrode 52 is shown as covering only the edge of each diode stack. Instead, the electrode 52 may be transparent, for example formed from ITO, and then may cover the top of the diode stack. Also, an alternative to the use of an intermediate metal shield 48 could be to prevent light reaching the lower switching diode by using appropriate layers, such as relatively thick intrinsic layer 44 and n-type layers 40, 42. There are many possible ways to illuminate the photodiodes of the control circuitry as will be appreciated by those skilled in the art. This will involve appropriate selection of transparent and opaque layers.

Although in the figures, the diode stacks of the control circuitry appear to occupy the same area as the diode stacks of the pixels, the control circuitry elements may occupy a greater area, and may have an elongated shape rather than the substantially square shape of the pixels.

The effect of constantly illuminating the photodiodes of the control circuitry 14 will now be explained with reference to FIG. 4 to 6.

Figure 4:
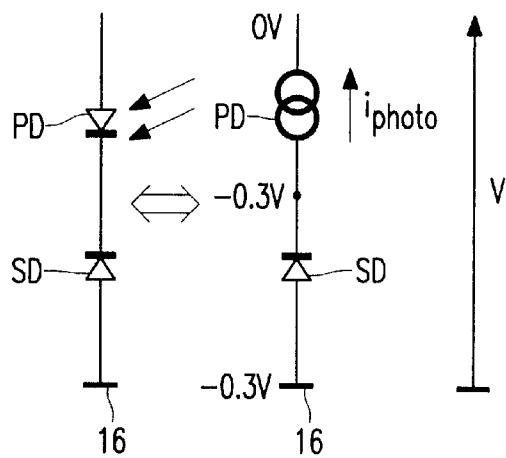
FIG. 4 shows the equivalent circuit of the device elements of the control circuity shown in FIG. 3.

Shown in FIG. 4 is the equivalent circuit of the elemental devices of the control circuitry 14. As shown, the illuminated photodiode can be represented by a constant current source which produces a current depending upon the photosensitivity of the photodiode and the level of illumination. Of course, different pixel configurations will give rise to different orientations of the switching diode SD and photodiode PD. The circuit shown in FIG. 4 represents the pixel configuration of FIG. 2. Thus, the switching diode SD is positioned adjacent to substrate 16 and connected at its anode to the substrate. Whatever the pixel configuration for the back to back diodes, the photodiode current will be generated in the forward bias direction of the switching diode SD, as shown in FIG. 4.

Figure 5:
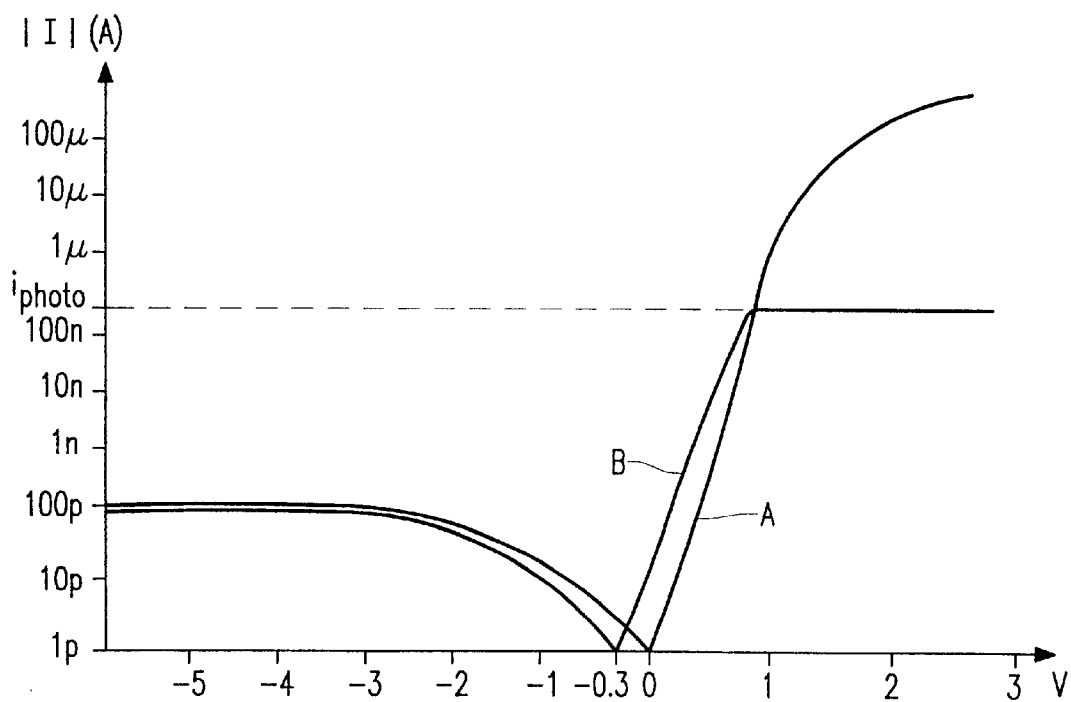
FIG. 5 shows the current voltage characteristics of a diode and of the circuit shown in FIG. 5.

FIG. 5 shows the current-voltage characteristic of an individual diode and of the circuit shown in FIG. 4.

Curve A shows the response of an individual diode. At negative voltages, leakage currents of the order of 100 pA flow. For forward bias of the diode, the current increases as shown in the Figure. The model used for in FIG. 5 assumes diode dimensions of 200 micrometers×200 micrometers.

Curve B represents the current-voltage characteristic of the circuit shown in FIG. 4, again for a diode stack covering an area of 200 micrometers×200 micrometers. When the switching diode is reversed biased, the photodiode is isolated, and consequently the photocurrent produced as a result of the incident light creates a potential difference across the photodiode, since the photocurrent cannot flow. Thus, the cathode of the photodiode is at a potential of approximately 0.3 volts below potential of the anode. As a result, as soon as the anode of the switching diode reaches approximately 0.3 volts below the potential of the anode of photodiode, the switching diode becomes forward biased. FIG. 4 shows the voltages at points of the circuit when the switching diode just becomes forward biased.

For this reason, a forward current begins to flow through the circuit shown in FIG. 4 when the voltage V across the circuit increases above approximately −0.3V. This is shown in Curve B of FIG. 5.

The effect of the current source in series with the switching diode, for forward biased conditions of the switching diode, can be seen in FIG. 5. Once the forward current reaches the photodiode current, no additional current can flow, since the photodiode is reversed biased and only the photodiode current can flow. Thus, Curve B levels out at approximately 200 nA which represents the photodiode current for an illumination of 10,000 Lux.

Figure 6:
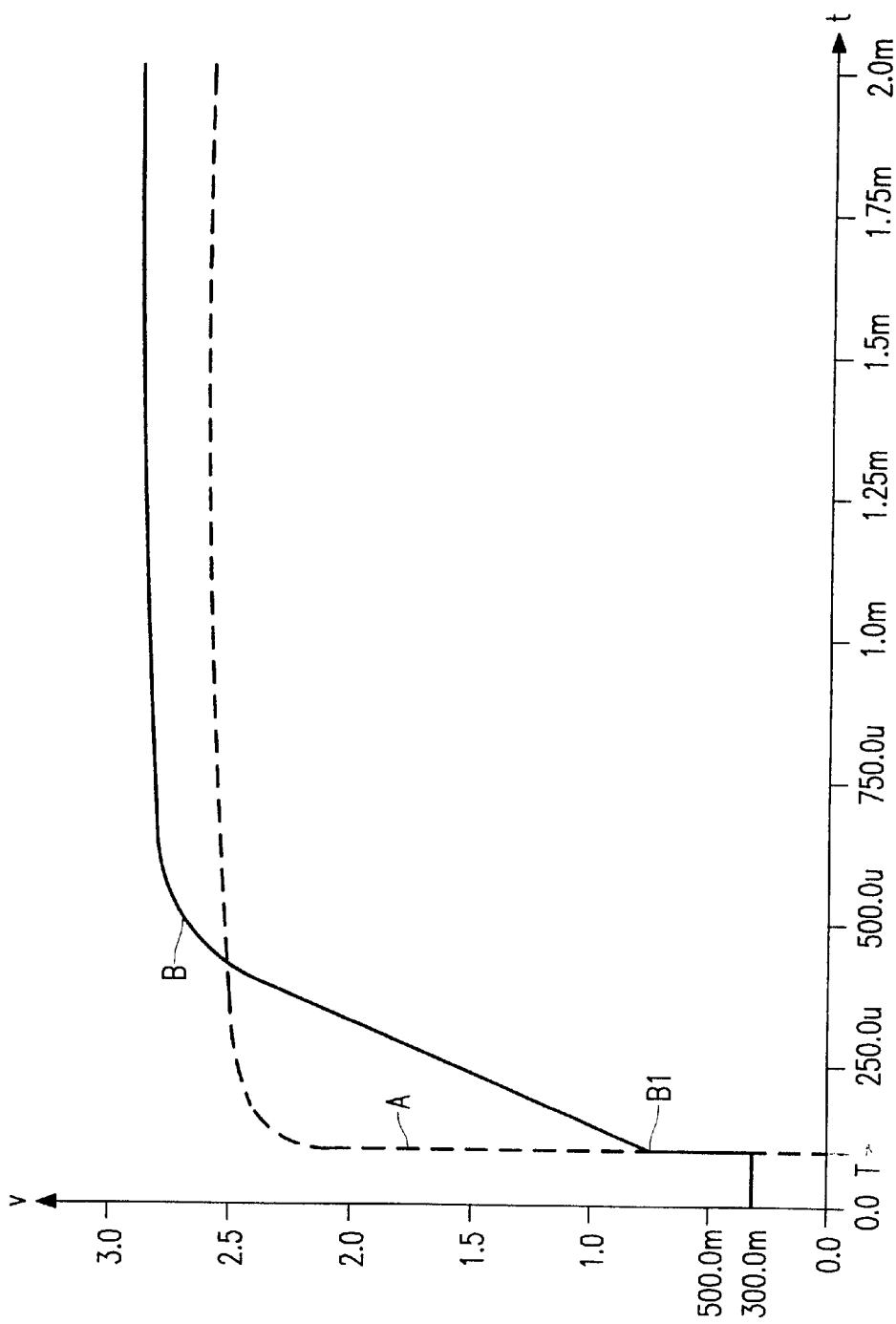
FIG. 6 shows the use of a conventional diode and of the circuit shown in FIG. 5 for charging a capacitance in response to a step voltage.

FIG. 6 shows the charging characteristics of a capacitor of 40 pF being charged by a 3 Volt voltage step through a diode and through the circuit of FIG. 4. The voltage across the capacitor is measured over time, and the input voltage step is applied at time T to the previously discharged capacitor.

Curve A represents the charging characteristics of the capacitor through a forward biased diode. The initial charging of the capacitor is very rapid and only when the voltage across the capacitor approaches the final voltage does the rate of charging decrease appreciably.

Curve B represents the charging of the same capacitor through the circuit of FIG. 4. Before the voltage step at time T, the capacitor is charged to a voltage of 0.3V, again because the switching diode is forward biased and allows the capacitor to charge until the anode of the photodiode is at 0.3V. At time T, there is an initial voltage step on the capacitor and this is the result of capacitive coupling between the switching diode and photodiode capacitances and the capacitor to be charged. This accounts for the initial increase in voltage to point B1. However, beyond this point, the maximum capacitor charging current that can flow through the circuit of FIG. 4 is limited to approximately 200 nA as can be seen from FIG. 5. This maximum current corresponds to the rate of increase in voltage shown by the linear portion of Curve B. Only when the capacitor is almost charged to the final voltage does the recharging current drop below the photodiode current and the recharging curve resumes the usual inverse—exponential recharging profile.

FIG. 6 shows that the switching speed of the circuit of FIG. 4 is slower than that of a diode. Thus, for charging a capacitance of 40 pF, which is representative of the capacitance of a row of pixels of the type shown in FIG. 1, the switching speed is of the order of 300 μsecs. For the purposes of forming row driver circuitry, this constraint does not prohibit the use of the circuit of FIG. 4. For example, for document scanning applications, a row pulse of duration 1 ms is required to read an A4 image at 600 dpi in 5 seconds. The above delay will not significantly increase the image retrieval time. Furthermore, it is possible to reduce the delay in the response of the diode stack by increasing the size of the diodes. As explained, the diodes in the control circuitry are not constrained to have the same dimensions as the pixel diode stacks.

Figure 7:
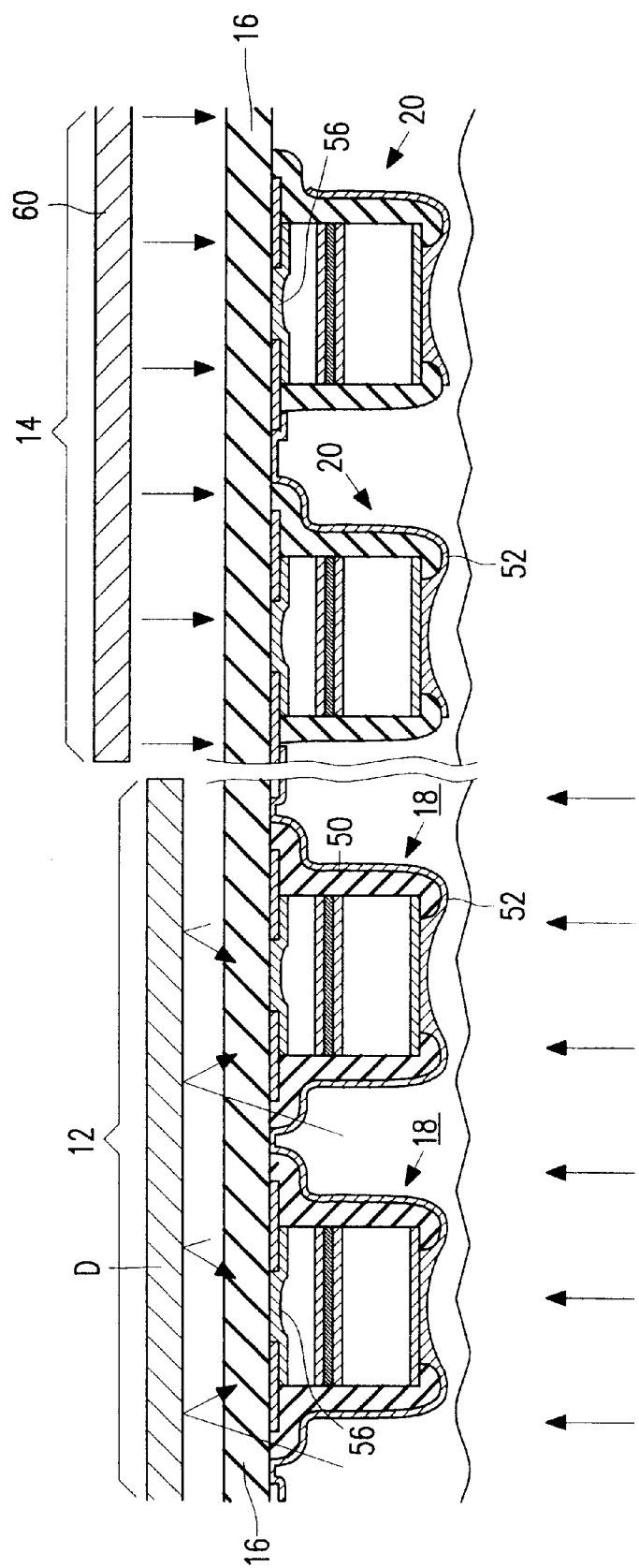
FIG. 7 shows one alternative arrangement of image sensor according to the invention.

FIG. 7 shows one alternative arrangement of image sensor according to the invention.

In the arrangement shown in FIG. 7 the lower diode (closest to the substrate 16) comprises the photosensitive diode. In this case, the illumination for the image sensing portion 12 of the array is from the same side of the substrate 30 as the diode stacks 34. In order to enable the passage of light to the photosensitive diode, an opening 56 is defined in the bottom metal contact 32. To prevent light passing directly into the switching diode on top of the diode stack, the electrode layer 52 may cover the top of the diode stack, as shown in FIG. 7. The alternative to the use of openings 56 as shown in FIG. 7 would be to use transparent bottom metal contacts 32, formed from indium tin oxide (ITO) for example.

The control circuitry portion 14 of the image sensor 10 shown in FIG. 7 comprises a light source 60 for directly illuminating the photodiodes of the control circuitry. In this case, the light source 60 is separate to the light source used for the image sensing operation. Of course, a single light source could be used, with the control circuitry 14 again including a reflection system as described with reference to FIG. 3. Similarly, although in the examples shown the image sensing is carried out by reflection of light from the documents, for some applications the light could be shone through the document so that for the arrangement shown in FIG. 7, the light source of the image sensing portion 12 could be disposed on the opposite side of the document D to the substrate 30. Indeed, the image sensing light source can be of any suitable design. The image sensor of the invention may, of course, be used in applications other than document imaging, for example as a medical X-ray imaging device. This could require the use of a radiation conversion device to convert incident X-rays into light for detection by the image sensor pixels. Such a system would not require an image sensing light source.

The control circuitry portion 14 of the image sensor array 10 shown in FIG. 7 has been patterned to include two series connected diodes. In this way, electrode layer 52 connects the top of one diode stack to the base of the other. The two series connected diodes would form part of the row driver circuitry or column reading circuitry as desired. There may be some spacing between the control circuitry 14 and the image sensing portion 12, and for this reason the two portions are shown disconnected in FIGS. 3 and 7. A minimum separation may be required so that a separate light source 60 of the control circuitry does not interfere with the image sensing pixels or so that the reflection surface provided for the control circuitry 14 may be formed as a separate mechanical component (not integrated onto the substrate) with sufficient accuracy that there is no overlap into the image sensing array. In a document scanner, the image sensing area may comprise an A4 size array of pixels and the control circuitry may be provided around 3 edges of the array so that the remaining fourth edge may be inserted into a book to abut with the spine and take a full copy of the book page. The image sensor array of the invention may of course be used in a flat-bed document scanner or other image sensing apparatus of various types, with the control circuitry spaced all around the image sensing array.

Although the pixel configuration of the invention enables a reduction in the size of the pixels, the invention array be applied to pixels having any dimension, since the advantages of the four-mask deposition process for the pixels and control circuitry are equally applicable to pixels of larger dimensions.

From reading the present disclosure, other modifications will be apparent to persons skilled in the art. Such modifications may involve other features which are already known in the design and use of electrical or electronic circuits and component parts thereof and which may be used instead of or in addition to features already described herein.

What is claimed is:

1. An image sensor having an imaging area comprising an array of image sensing pixels, each of which is responsive in operation of the sensor to light input dependent on the image being sensed, and peripheral control circuitry comprising a plurality of elemental devices arranged outside the imaging area and which are connected to the array and are operable to drive the image sensing pixels of the array, the image sensing pixels of the array and the elemental devices of the peripheral control circuitry being provided on a common substrate and being defined by layers provided on the substrate, each image sensing pixel and each elemental device of the control circuitry comprising a diode stack comprising a photodiode and a switching diode connected in series with opposite polarity and disposed one above the other with respect to the substrate, the image sensor further comprising illumination means arranged to illuminate constantly the photodiodes of the elemental devices of the control circuitry during operation of the sensor, the illumination being such that said photodiodes of the elemental devices function as constant current sources connected in series with said switching diodes of the elemental devices during operation of the sensor.

2. An image sensor as claimed in claim 1, wherein the photodiode and the switching diode comprise amorphous silicon devices.

3. An image sensor as claimed in claim 1, wherein the layers comprise semiconductor layers and one of the photodiode and the switching diode comprises a p-type semiconductor layer, an intrinsic semiconductor layer over the p-type layer, and an n-type semiconductor layer over the intrinsic layer, and the other of the photodiode and the switching diode comprises an n-type semiconductor layer, an intrinsic semiconductor layer over the n-type layer, and a p-type semiconductor layer over the intrinsic semiconductor layer.

4. An image sensor as claimed in claim 1, wherein a light shielding layer is provided within each diode stack between the photodiode and the switching diode.

5. An image sensor as claimed in claim 1, wherein the photodiode is disposed above the switching diode with respect to the substrate.

6. An image sensor as claimed in claim 5, wherein the illumination means provides light to the image sensor array from the side of the substrate opposite to the layers provided on the substrate, and reflection means is provided over the control circuitry for reflecting the light to the photodiode of the elemental devices.

7. An image sensor as claimed in claim 1, wherein the photodiode is disposed below the switching diode with respect to the substrate, and the semiconductor layers are each disposed over a conducting contact portion, each contact portion including an opening which allows the passage of light to the photodiode of the respective diode stack or elemental device.

8. An image sensor as claimed in claim 7, wherein the illumination means provides light to the image sensor array from the side of the substrate opposite to the layers provided on the substrate.

9. An image sensor as claimed in claim 1, comprising a document imaging system, wherein the illumination means comprises a light source of the image sensor for illuminating the document to be imaged.

10. An image sensor as claimed in claim 1, wherein the pixels are arranged in rows and columns, and the control circuitry comprises row driver circuitry and/or column reading circuitry.

* * * * *